United States Patent [19]

Mochizuki et al.

[11] 4,313,180
[45] Jan. 26, 1982

[54] REFRESH SYSTEM FOR A DYNAMIC MEMORY

[75] Inventors: Daisuke Mochizuki; Shigeru Kitano, both of Nara, Japan

[73] Assignee: Sharp Kabushiki Kaisha, Osaka, Japan

[21] Appl. No.: 117,004

[22] Filed: Jan. 30, 1980

[30] Foreign Application Priority Data

Jan. 30, 1979 [JP] Japan ................................. 54-10044

[51] Int. Cl.³ .................................................. G11C 7/00
[52] U.S. Cl. ...................................... 365/222; 365/229
[58] Field of Search ........................ 365/222, 228, 229

[56] References Cited
U.S. PATENT DOCUMENTS 3,760,379 9/1973 Nibby et al. ........................ 365/222
4,005,395 1/1977 Fosler et al. ........................ 365/229
4,104,734 8/1978 Herndon ............................. 365/228

Primary Examiner—Stuart N. Hecker
Attorney, Agent, or Firm—Birch, Stewart, Kolasch and Birch

[57] ABSTRACT

An electronic apparatus comprises a central processor unit (CPU) for controlling the operation of the electronic apparatus, and a dynamic random access memory (RAM). The CPU develops a refresh control signal for refreshing the memory data stored in the dynamic RAM. An additional refresh control circuit is provided outside of the CPU for developing another refresh control signal. The additional refresh control circuit is connected to receive the electric power from a backup battery included in the electronic apparatus. When the service interruption occurs, the additional refresh control circuit is enabled to maintain the memory data stored in the dynamic RAM.

7 Claims, 5 Drawing Figures

4,313,180

REFRESH SYSTEM FOR A DYNAMIC MEMORY

BACKGROUND AND SUMMARY OF THE INVENTION

The present invention relates to a refresh system for a dynamic memory such as a dynamic random access memory.

A dynamic random access memory (RAM) is superior to a static RAM and a C-MOS RAM, because the dynamic RAM provides a great memory capacity with a low cost. However, the dynamic RAM inevitably requires a refresh system for maintaining the memory data therein. The dynamic RAM also consumes more electric power than the C-MOS RAM. Accordingly, in the conventional system, the dynamic RAM is used only for an outer memory or a buffer memory for the outer memory, wherein a memory backup is not required.

If the dynamic RAM is incorporated in a system, the electric power must be continuously applied to a peripheral circuit of the dynamic RAM even when a main power supply is terminated, for memory backup purposes. One conventional memory backup method is to employ a circuit for continuously applying A.C. power to the peripheral circuit of the dynamic RAM even though the system operation is not required. In this method, an additional A.C. power input system is required for the peripheral circuit of the dynamic RAM. Another conventional memory backup method is to employ a battery of great capacity for supplying power to the entire system while the main power supply is interrupted. This method is not practical since a large capacity battery is required.

Accordingly, an object of the present invention is to provide a novel memory refresh system for a dynamic memory.

Another object of the present invention is to provide a control circuit for enhancing the reliability of a dynamic random access memory (RAM).

Still another object of the present invention is to provide a memory backup system for a dynamic RAM, which requires a small capacity battery.

Other objects and further scope of applicability of the present invention will become apparent from the detailed description given hereinafter. It should be understood, however, that the detailed description and specific examples, while indicating preferred embodiments of the invention, are given by way of illustration only, since various changes and modifications within the spirit and scope of the invention will become apparent to those skilled in the art from this detailed description.

To achieve the above objects, pursuant to an embodiment of the present invention, an electronic apparatus includes a central processor unit (CPU) which develops a first refresh control signal for refreshing the memory data stored in the dynamic RAM. Another refresh control circuit is provided for developing a second refresh control signal to maintain the memory data stored in the dynamic RAM. When the main power is applied to the electronic apparatus, the dynamic RAM receives the first refresh control signal derived from the CPU. When the main power supply is interrupted, the dynamic RAM receives the second refresh control signal derived from the refresh control circuit which is operated by a small capacity battery.

BRIEF DESCRIPTION OF THE DRAWINGS

The present invention will be better understood from the detailed description given hereinbelow and the accompanying drawings which are given by way of illustration only, and thus are not limitative of the present invention and wherein.

DESCRIPTION OF THE PREFERRED EMBODIMENTS

Figure 1:
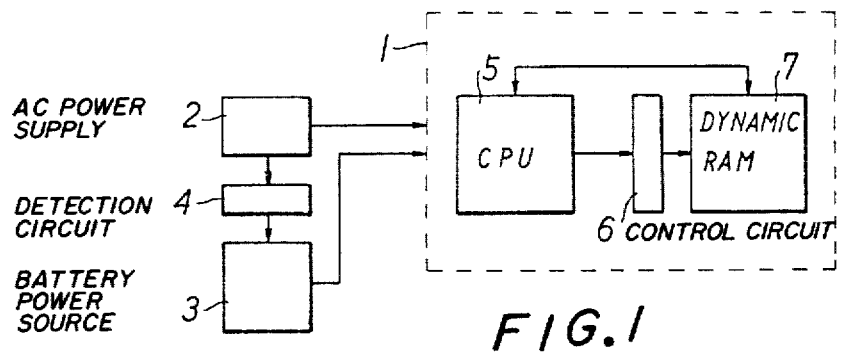
FIG. 1 is a schematic block diagram of a conventional refresh control circuit for a dynamic RAM.

FIG. 1 shows a conventional refresh control circuit for a dynamic RAM, which employs a large capacity battery for supplying the electric power to the entire system when the main power supply is interrupted.

An electronic apparatus 1 is supplied with power from an A.C. power supply source 2. A detection circuit 4 is provided for detecting the operating state of the A.C. power supply source 2. The electronic apparatus 1 comprises a central processor unit (CPU) 5 for controlling the operation of the electronic apparatus 1, a dynamic random access memory (RAM) 7, and a control circuit 6 for controlling the address selection of the dynamic random access memory 7 and the memory refresh of the dynamic RAM 7. When the A.C. power supply source 2 is turned off, the detection circuit 4 develops a control signal for activating a battery power source 3 which supplies power to the entire system of the electronic apparatus 1.

Figure 2:
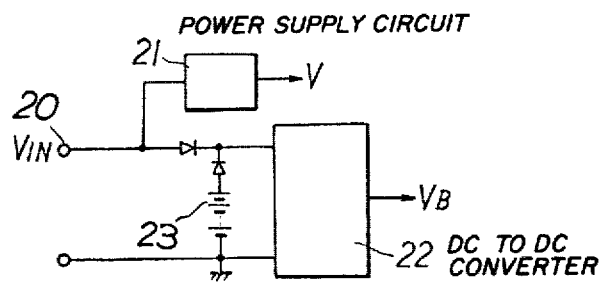
FIG. 2 is a block diagram of a power supply circuit employed in a refresh system of the present invention.

FIG. 2 shows a power supply circuit employed in a memory refresh system of the present invention.

The power supply circuit comprises an input terminal 20 for receiving a D.C. power $V_{in}$ from a rectifying circuit which is connected to an A.C. power source. A first power supply circuit 21 is connected to the input terminal 20 for developing a power V toward a control circuit of an electronic apparatus. A DC-DC converter 22 is also connected to the input terminal 20 for developing a power $V_B$ toward a peripheral circuit of the dynamic RAM. A battery 23 is interposed between the input terminal 20 and the DC-DC converter 22 for supplying the power to the DC-DC converter 22 when the application of the D.C. power $V_{in}$ is interrupted.

Accordingly, when the D.C. power $V_{in}$ is ON, the control circuit of the electronic apparatus is supplied with power from the first power supply circuit 21, and the dynamic RAM and the peripheral circuit thereof are supplied with power from the DC-DC converter 22 which is supplied with the D.C. power $V_{in}$. If the D.C. power $V_{in}$ is OFF, the DC-DC converter 22 is supplied with power from the battery 23, whereby only the dynamic RAM and the peripheral circuit thereof are supplied with power from the DC-DC converter 22 for refreshing purposes.

Figure 3:
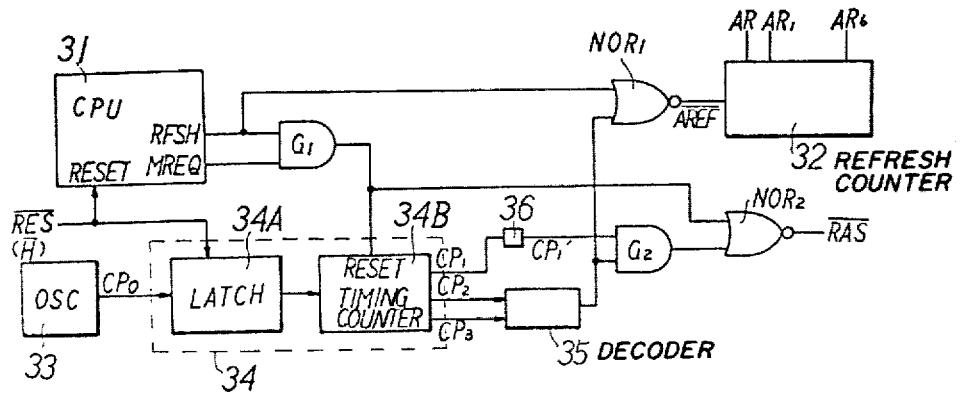
FIG. 3 is a block diagram of an embodiment of a refresh control circuit for a dynamic RAM of the present invention.
Figure 4:
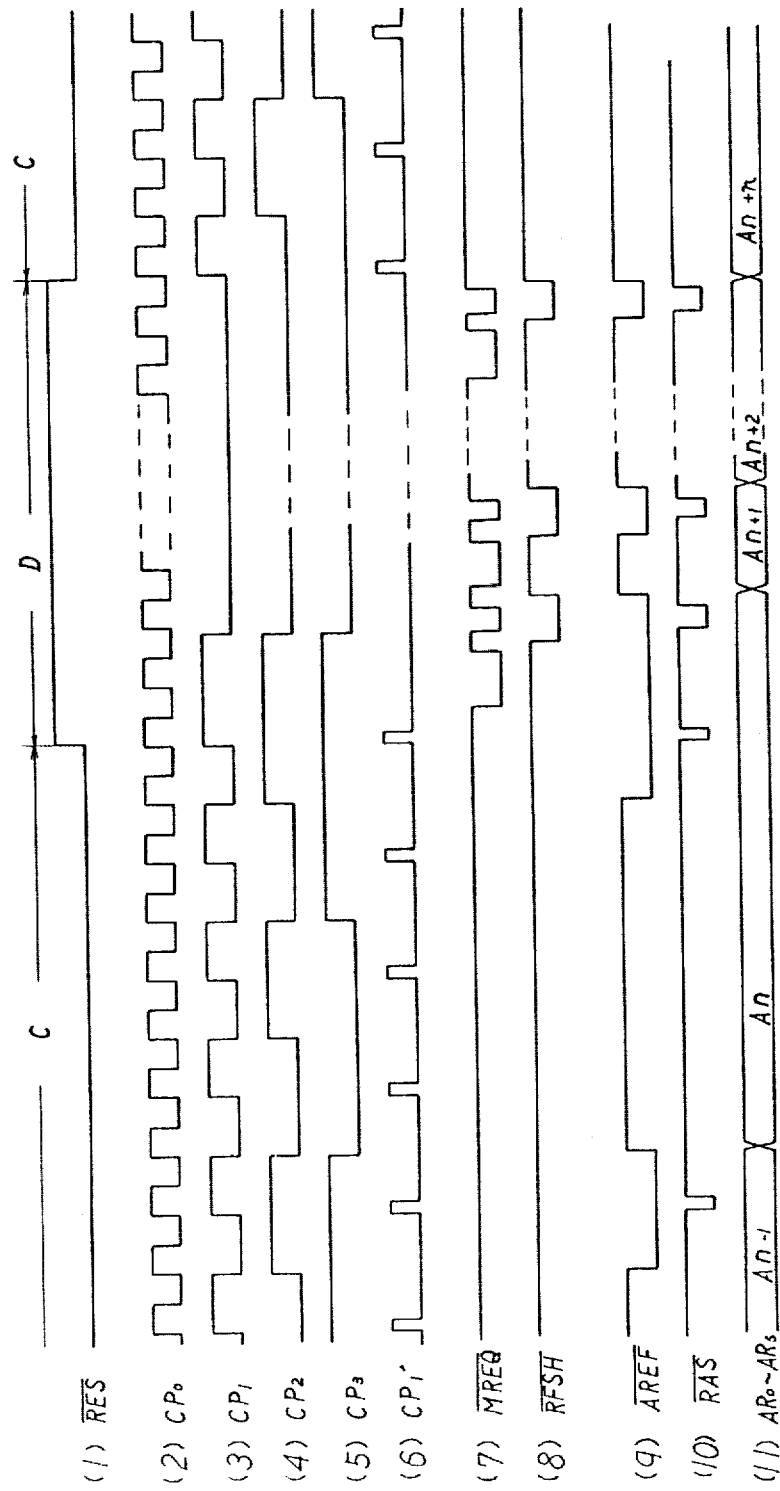
FIG. 4 is a time chart showing various signals occurring within the refresh control circuit of FIG. 3.

FIG. 3 shows an embodiment of a refresh control circuit of the present invention for refreshing the dynamic RAM. FIG. 4 shows various signals occurring within the refresh control circuit of FIG. 3.

The refresh control circuit of FIG. 3 mainly comprises a central processor unit (CPU) 31 for developing various control signals required in the electronic apparatus. The CPU 31 is supplied with power from the first power supply circuit 21 shown in FIG. 2 to develop a refresh timing signal RFSH for refreshing the dynamic RAM, and a strobe signal MREQ. The refresh timing signal RFSH and the strobe signal MREQ are shown in FIG. 4, respectively.

Figure 5:
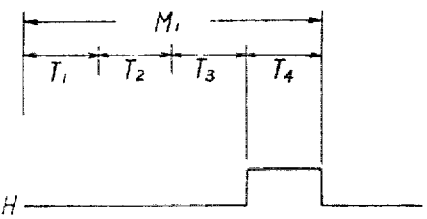
FIG. 5 is a chart showing a refresh timing signal developed from a central processor unit (CPU) employed in the refresh control circuit of FIG. 3.

The CPU 31 is preferably made of "CPU8080" manufactured by Intel Corporation. The refresh timing signal RFSH is developed at a blank time period $T_4$ within an instruction fetch cycle $M_1$ ($T_1$–$T_4$) as shown in FIG. 5.

The above-discussed refresh timing signal RFSH and the strobe signal MREQ derived from the CPU 31 are applied to an AND gate $G_1$, of which an output signal is applied to a NOR gate $NOR_2$ to develop an $\overline{RAS}$ signal which is applied to the dynamic RAM for refresh purposes. The refresh timing signal RFSH is also applied to another NOR gate $NOR_1$ to develop a refresh address control signal $\overline{AREF}$. The refresh address control signal $\overline{AREF}$ is applied to a refresh counter 32 which counts up at the leading edge of the refresh address control signal $\overline{AREF}$ to develop address signals toward the dynamic RAM through output terminals $AR_0$–$AR_6$. More specifically, in accordance with the control signals derived from the CPU 31, the refresh counter 32 sequentially addresses the memory sections in the dynamic RAM, and the thus selected memory section is refreshed by the signal $\overline{RAS}$ developed through the NOR gate $NOR_2$.

An oscillator 33 and a timing counter 34 are provided, in addition to the CPU 31, for refreshing purposes. The timing counter 34 comprises a latch circuit 34A and a counter 34B. The oscillator 33 develops a clock signal $CP_0$, which is applied to the timing counter 34 for developing timing signals $CP_1$, $CP_2$ and $CP_3$. The timing signals $CP_2$ and $CP_3$ are applied to a decoder 35, of which an output signal is applied to the NOR gate $NOR_1$ to develop the refresh address control signal $\overline{AREF}$. The timing signal $CP_1$ is applied to a differentiation circuit 36 to obtain a differentiated timing signal $CP_1'$. The thus obtained differentiated timing signal $CP_1'$ and the output signal of the decoder 35 are applied to an AND gate $G_2$, of which an output signal is applied to the NOR gate $NOR_2$ to develop the signal $\overline{RAS}$ for refreshing purposes.

More specifically, in accordance with the timing signals $CP_1$, $CP_2$ and $CP_3$ developed from the timing counter 34, the refresh address control signal $\overline{AREF}$ is applied to the refresh counter 32 through the decoder 35 and the NOR gate $NOR_1$. And, the signal $\overline{RAS}$ is applied to the selected memory section, for refreshing purposes, through the AND gate $G_2$ and the NOR gate $NOR_2$. The above-discussed refresh control system other than the CPU 31 is supplied with power from the DC-DC converter 22 shown in the power supply circuit of FIG. 2.

A control signal $\overline{RES}$ is applied to the refresh control circuit of FIG. 3. The control signal $\overline{RES}$ is developed from a state detection circuit such as the detection circuit 4 shown in FIG. 1. As shown in FIG. 4(1), the control signal $\overline{RES}$ bears the logic "Low" when the D.C. power $V_{in}$ in FIG. 2 is OFF (period C), and the logic "High" when the D.C. power $V_{in}$ in FIG. 2 is ON (period D). The control signal $\overline{RES}$ is applied to the CPU 31 and the latch circuit 34A so that the CPU 31 controls the refresh operation when the control signal $\overline{RES}$ bears the logic "High". When the control signal $\overline{RES}$ bears the logic "Low," the battery 23 in FIG. 2 supplies the oscillator 33 and the timing counter 34 with power for refreshing the dynamic RAM.

At the moment when the control signal $\overline{RES}$ changes from the logic "Low" to the logic "High," the latch circuit 34A functions to hold the contents stored in the counter 34B. The counter 34B is subsequently reset by the signals RFSH and MREQ developed from the CPU 31.

Operation modes of the refresh control circuit of FIG. 3 will be described with reference to the FIG. 4 time chart.

[WHEN MAIN POWER SUPPLY IS OFF (BACKUP MODE)]

When the D.C. power $V_{in}$ is OFF, the control signal $\overline{RES}$ bears the logic "Low" as shown in the period C of FIG. 4(1). The CPU 31 is reset, and the oscillator 33 and the timing counter 34 are enabled. Accordingly, the clock signal $CP_0$ developed from the oscillator 33 is applied to the timing counter 34 to develop the timing signals $CP_1$, $CP_2$ and $CP_3$. The timing signals $CP_2$ and $CP_3$ are used to obtain the refresh address control signal $\overline{AREF}$ to be applied to the refresh counter 32. For example, the refresh counter 32 develops address selection signals through the output terminals $AR_0$–$AR_6$ for selecting the address $(A_n-1)$ of the dynamic RAM as shown in FIG. 4 (11). The differentiated timing signal $CP_1'$ is applied to one input terminal of the AND gate $G_2$. The differentiation circuit 36 is provided for narrowing the pulse width of the refresh signal $\overline{RAS}$ when the circuit is supplied with power from the battery 23 of FIG. 2, thereby minimizing the power consumption. The AND gate $G_2$ develops an AND output in response to the differentiated timing signal $CP_1'$ and the output signal of the decoder 35 for refreshing the address $(A_n-1)$ of the dynamic RAM. The dynamic RAM is sequentially refreshed through the use of the timing signals derived from the timing counter 34.

[WHEN MAIN POWER SUPPLY IS SWITCHED FROM OFF TO ON STATE]

When the D.C. power $V_{in}$ is changed from OFF to ON, the control signal $\overline{RES}$ is changed from the logic "Low" to the logic "High." The CPU 31 is enabled, and the count operation in the timing counter 34 is terminated. The contents stored in the counter 34B are maintained. The timing signals $CP_1$, $CP_2$ and $CP_3$ are held unchanged until the timing counter 34B is reset. Then, the CPU 31 develops the refresh timing signal RFSH and the strobe signal MREQ. Even though the refresh timing signal RFSH is applied to the NOR gate $NOR_1$, the NOR gate $NOR_1$ still develops the refresh address control signal $\overline{AREF}$ in accordance with the contents held in the counter 34B and, therefore, the contents stored in the refresh counter 32 are not changed. In this example of FIG. 4, the address $A_n$ is selected.

The refresh timing signal RFSH and the strobe signal MREQ are applied to the AND gate $G_1$, which develops the refresh signal $\overline{RAS}$ through the NOR gate $NOR_2$. The output signal of the AND gate $G_1$ is also applied to the timing counter 34 to reset the counter 34B. In this example, the address $A_n$ is again refreshed when the control signal $\overline{RES}$ is changed from the logic "Low" to the logic "High" to ensure the stable refresh operation. Thereafter, the refresh operation is conducted in accordance with the control signals developed from the CPU 31.

[WHEN MAIN POWER SUPPLY IS SWITCHED FROM ON TO OFF STATE]

When the D.C. power $V_{in}$ is changed from ON to OFF, the control signal $\overline{RES}$ is changed from the logic "High" to the logic "Low." When the D.C. power $V_{in}$ is reduced to a predetermined level due to, for example, the service interruption, the CPU 31 detects the abnormal condition to perform the interruption treatment and, then the operation of the CPU 31 is terminated. The CPU 31 is reset by the subsequently occurring change of the logic value of the control signal $\overline{RES}$. When the control signal $\overline{RES}$ bears the logic "Low," the oscillator 33 and the timing counter 34 are enabled to perform the refreshing of the dynamic RAM.

The invention being thus described, it will be obvious that the same may be varied in many ways. Such variations are not to be regarded as a departure from the spirit and scope of the invention, and all such modifications are intended to be included within the scope of the following claims.

What is claimed is:

1. A refresh control system for a dynamic memory in an electronic apparatus powered by a main power source, said refresh control system comprising:
   a central processor unit including a first refresh control signal developing means powered by said main power source for developing a first refresh control signal;
   second refresh control signal developing means separate from said central processor unit and capable of being powered by an auxiliary power source for developing a second refresh control signal, said auxiliary power source providing power to said second refresh control signal developing means when the power to said first refresh control signal developing means has been interrupted, said second refresh control signal developing means including oscillator means, timing counter means responsive to the output of said oscillator means for developing a plurality of timing signals, holding circuit means connected between said oscillator means and said timing counter means for holding the output of said timing counter means at its current value following the restoration of the supply power to the first refresh control signal developing means, and further means responsive to the timing signals from the timing counter means for developing said second refresh control signal;
   determination means responsive to the power supplied by the main power source and by the auxiliary power source for detecting whether the power from the main power source being supplied to the first refresh control signal developing means has been interrupted and for developing a first control signal when the power has not been interrupted and developing a second control signal when the power has been interrupted; and
   selection control means responsive to the first and second control signals for enabling said first refresh control signal developing means in response to said first control signal and for enabling said second refresh control signal developing means in response to said second control signal.

2. A refresh control system in accordance with claim 1, wherein the second control signal is developed in response to the power supplied by the auxiliary power source, the first control signal being developed in response to the power supplied by the main power source.

3. The refresh control system of claim 1, wherein said auxiliary power source comprises a battery included in said electronic apparatus for backup purposes.

4. The refresh control system of claim 3 or 1, wherein said
   holding circuit means holds the output signals derived from said second refresh control signal developing means for a predetermined period of time following the restoration of the supply of power to the first refresh control signal developing means.

5. The refresh control system of claims 3 or 1, wherein said further means comprises:
   decoder means responsive to said timing signals for developing refresh address selection signals; and
   refresh pulse source means for developing said second refresh control signal in response to said timing signals derived from said timing counter means and to said refresh address selection signals.

6. The refresh control system of claim 5, wherein said refresh pulse source means further comprises a differentiation circuit for differentiating one of said timing signals derived from said timing counter.

7. The refresh control system of claim 5, wherein said holding circuit means comprises a latch circuit connected to receive an output signal developed from said oscillator means, said timing counter being connected to receive an output signal developed from said latch circuit.

* * * * *